United States Patent
Alptekin et al.

(10) Patent No.: US 12,062,703 B2
(45) Date of Patent: Aug. 13, 2024

(54) SELF ALIGNED REPLACEMENT METAL SOURCE/DRAIN FINFET

(71) Applicant: TESSERA LLC, San Jose, CA (US)

(72) Inventors: Emre Alptekin, Fishkill, NY (US); Robert R. Robison, Colchester, VT (US); Reinaldo A. Vega, Wappingers Falls, NY (US)

(73) Assignee: Tessera LLC, San Jose, CA (US)

( * ) Notice: Subject to any disclaimer, the term of this patent is extended or adjusted under 35 U.S.C. 154(b) by 0 days.

(21) Appl. No.: 17/070,728

(22) Filed: Oct. 14, 2020

(65) Prior Publication Data

US 2021/0028287 A1 Jan. 28, 2021

Related U.S. Application Data

(60) Continuation of application No. 16/459,685, filed on Jul. 2, 2019, now Pat. No. 10,818,759, which is a continuation of application No. 15/136,238, filed on Apr. 22, 2016, now Pat. No. 10,418,450, which is a division of application No. 14/943,652, filed on Nov. 17, 2015, now Pat. No. 9,466,693.

(51) Int. Cl.
| | |
|---|---|
| *H01L 29/417* | (2006.01) |
| *H01L 29/06* | (2006.01) |
| *H01L 29/40* | (2006.01) |
| *H01L 29/45* | (2006.01) |
| *H01L 29/66* | (2006.01) |
| *H01L 29/78* | (2006.01) |

(52) U.S. Cl.
CPC .... *H01L 29/41791* (2013.01); *H01L 29/0649* (2013.01); *H01L 29/0653* (2013.01); *H01L 29/401* (2013.01); *H01L 29/45* (2013.01); *H01L 29/665* (2013.01); *H01L 29/66545* (2013.01); *H01L 29/66795* (2013.01); *H01L 29/785* (2013.01); *H01L 29/66803* (2013.01)

(58) Field of Classification Search
None
See application file for complete search history.

(56) References Cited

U.S. PATENT DOCUMENTS

| | | | |
|---|---|---|---|
| 5,838,026 A | 11/1998 | Kitagawa et al. | |
| 6,445,042 B1 | 9/2002 | Yu et al. | |
| 7,018,891 B2 | 3/2006 | Doris et al. | |
| 7,459,359 B2 | 12/2008 | Park et al. | |

(Continued)

FOREIGN PATENT DOCUMENTS

JP 2001110818 A 4/2001

OTHER PUBLICATIONS

Choi et al., "Dopant-Segregated Shottky Source/Drain FinFET with a NiSi FUSI Gate and Reduced Leakage Current," IEEE Transactions on Electron Devices, vol. 57, No. 11, Nov. 2010, pp. 2902-2906.

(Continued)

*Primary Examiner* — Daniel Whalen
(74) *Attorney, Agent, or Firm* — Haley Guiliano LLP

(57) ABSTRACT

A fin-shaped field effect transistor (finFET) device comprising includes a substrate. an insulating layer displaced over the substrate, and a fin. The device also includes a gate formed over the fin, the gate including: a gate stack; and a high-k dielectric on opposing side of the gate stack. The device further includes metallic source and drain regions formed over the fin and on opposing sides of the gate.

20 Claims, 12 Drawing Sheets

(56) References Cited

U.S. PATENT DOCUMENTS

| | | |
|---|---|---|
| 7,488,650 B2 | 2/2009 | Schulz |
| 7,498,632 B2 | 3/2009 | Lee |
| 7,566,619 B2 | 7/2009 | Ahn et al. |
| 7,723,762 B2 | 5/2010 | Kim et al. |
| 7,799,592 B2 | 9/2010 | Lochtefeld |
| 7,842,566 B2 | 11/2010 | Lee et al. |
| 8,148,772 B2 | 4/2012 | Doyle et al. |
| 8,222,646 B2 | 7/2012 | Wong et al. |
| 8,236,634 B1 | 8/2012 | Kanike et al. |
| 8,236,637 B2 | 8/2012 | Utomo et al. |
| 8,263,466 B2 | 9/2012 | Clifton et al. |
| 8,263,467 B2 | 9/2012 | Grupp et al. |
| 8,367,498 B2 | 2/2013 | Chang et al. |
| 8,445,334 B1 | 5/2013 | Basker et al. |
| 8,507,349 B2 | 8/2013 | Lee |
| 8,637,931 B2 | 1/2014 | Basker et al. |
| 8,658,523 B2 | 2/2014 | Faulkner et al. |
| 8,691,652 B2 | 4/2014 | Kuo et al. |
| 8,703,556 B2 | 4/2014 | Lu et al. |
| 8,815,693 B2 | 8/2014 | Alptekin et al. |
| 8,871,626 B2 | 10/2014 | Basker et al. |
| 8,921,940 B2 | 12/2014 | Kim et al. |
| 8,981,454 B2 | 3/2015 | Zhu et al. |
| 8,981,479 B2 | 3/2015 | Wang et al. |
| 8,987,093 B2 | 3/2015 | Harley et al. |
| 9,059,290 B2 | 6/2015 | Alptekin et al. |
| 9,064,745 B2 | 6/2015 | Pei et al. |
| 9,214,556 B2 | 12/2015 | Wann et al. |
| 9,236,397 B2 | 1/2016 | Holt et al. |
| 9,276,116 B2 | 3/2016 | Maeda et al. |
| 9,466,693 B1 | 10/2016 | Alptekin et al. |
| 9,502,408 B2 | 11/2016 | Kerber et al. |
| 9,536,878 B2 | 1/2017 | Kim |
| 9,583,487 B2 | 2/2017 | Giles et al. |
| 9,768,304 B2 | 9/2017 | Anderson et al. |
| 10,157,995 B2 | 12/2018 | Wang et al. |
| 10,418,410 B2 | 9/2019 | Alptekin et al. |
| 10,418,450 B2 | 9/2019 | Alptekin et al. |
| 2002/0195618 A1 | 12/2002 | Nihei et al. |
| 2006/0231907 A1 | 10/2006 | Kim et al. |
| 2008/0054300 A1 | 3/2008 | Nikkel et al. |
| 2009/0230464 A1 | 9/2009 | Taketani |
| 2013/0200444 A1 | 8/2013 | Wang et al. |
| 2013/0237026 A1 | 9/2013 | Lee et al. |
| 2014/0061792 A1 | 3/2014 | Bu et al. |
| 2014/0203370 A1* | 7/2014 | Maeda .............. H01L 29/66795 257/365 |
| 2015/0295089 A1* | 10/2015 | Huang .............. H01L 21/31116 438/283 |
| 2016/0233164 A1* | 8/2016 | Choi ................. H01L 29/41791 |

OTHER PUBLICATIONS

Choi et al., "Sub-20nm CMOS FinFET Technologies," Dept. of Electrical Engineering and Computer Sciences, University of California, Berkeley, CA; IEDM01-421-424 IEDM 01 2001 IEEE pp. 19.1.1 through 19.1.4.

Ramadout et al., "Multigate MOSFET in a Built Technology by Integrating Polysilicon-Filled Trenches," IEEE Electron Device Letters, vol. 30, No. 12, Dec. 2009, pp. 1350-1352.

Vega et al., "Comparative Study of FinFET Versus Quasi-Planar HTI-MOSFET for Ultimate Scalability," IEEE Transactions on Electron Devices, vol. 57, No. 12, Dec. 2010, pp. 3250-3256.

Vega et al., "Low-Standby-Power Bulk MOSFET Design Using High-k Trench Isolation," IEEE Electron Device Letters, vol. 30, No. 12, Dec. 2009, pp. 1380-1382.

Vega et al., "Three-Dimensional FinFET Source/Drain and Contact Design Optimization Study," IEEE Transactions on Electron Devices, vol. 56, No. 7, Jul. 2009, pp. 1483-1492.

Zhang et al., "Performance Fluctuation of FinFETs with Schottky Barrier Source/Drain," IEEE Electron Device Letters, vol. 29, No. 5, May 2008, pp. 506-508.

* cited by examiner

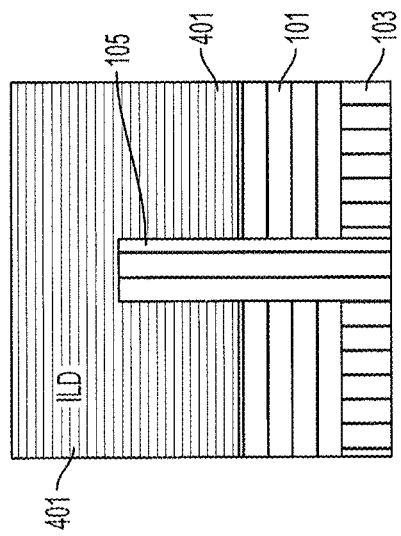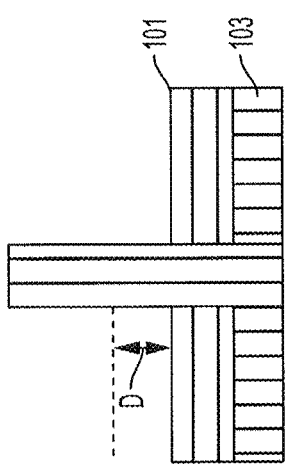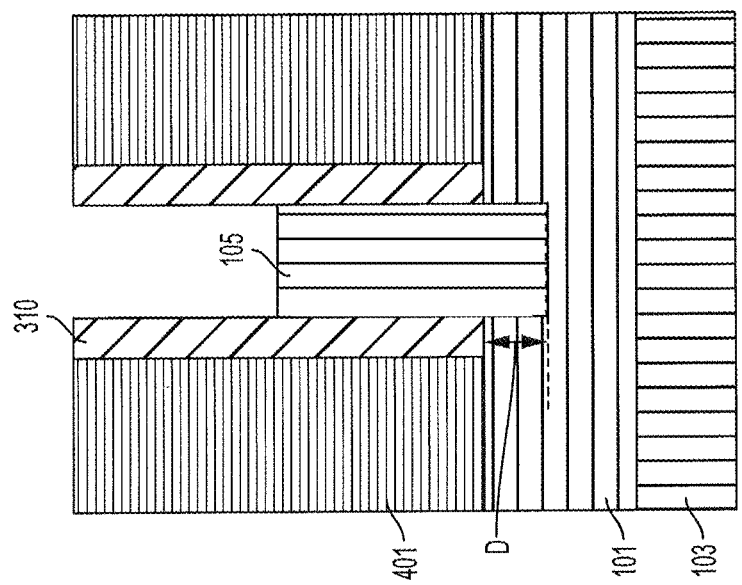
FIG. 5B
FIG. 5C
FIG. 5A

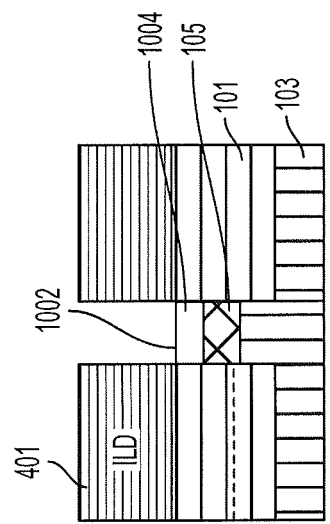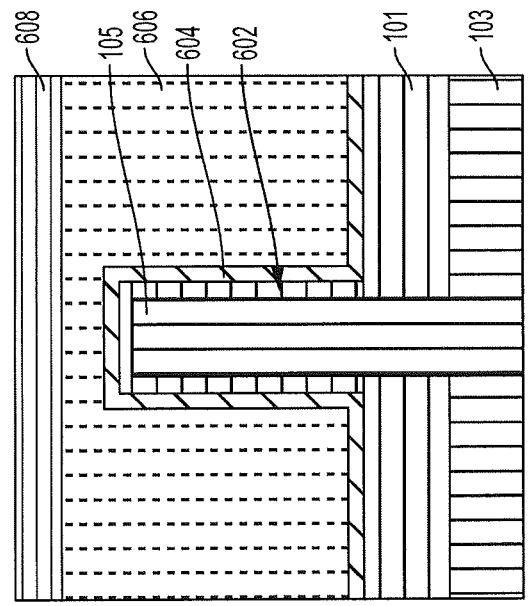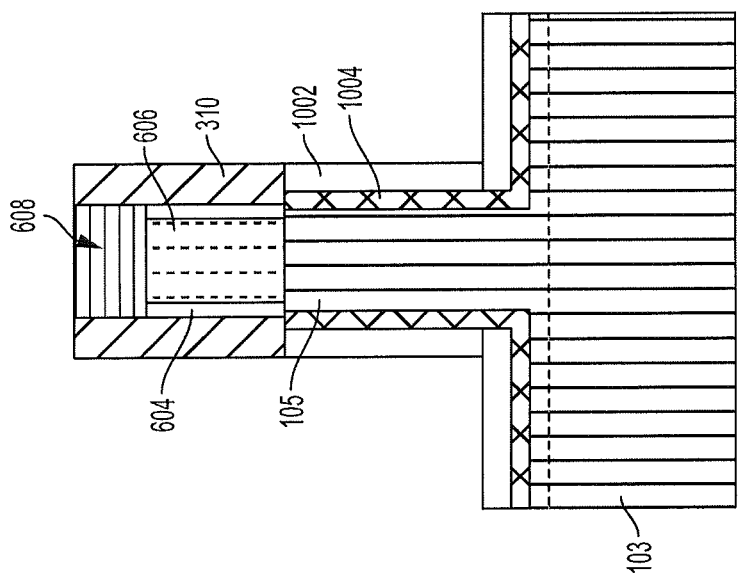

SELF ALIGNED REPLACEMENT METAL SOURCE/DRAIN FINFET

DOMESTIC PRIORITY

This application is a continuation of U.S. application Ser. No. 16/459,685, filed Jul. 2, 2019, which is a continuation of U.S. application Ser. No. 15/136,238, filed Apr. 22, 2016, now U.S. Pat. No. 10,418,450, which is a divisional of U.S. application Ser. No. 14/943,652, filed Nov. 17, 2015, now U.S. Pat. No. 9,466,693, the entire contents of each are incorporated herein by reference.

BACKGROUND

The present invention relates generally to semiconductor device processing techniques and, more particularly, to a method of a replacement metal source/drain fin-shaped field effect transistor (finFET).

The escalating demands for high density and performance associated with ultra large scale integrated (VLSI) circuit devices have required certain design features, such as shrinking gate lengths, high reliability and increased manufacturing throughput. The continued reduction of design features has challenged the limitations of conventional fabrication techniques.

SUMMARY

In one embodiment, a method of a fin-shaped field effect transistor (finFET) device is disclosed. The method includes: forming at least one fin that extends in a first direction; covering the fin with a dummy gate stack that extends in a second direction perpendicular to the first direction and that divides the at least one fin into source and drain regions on opposing sides of the replacement gate stack; covering the source and drain regions with an interlayer dielectric; replacing the dummy gate stack with a replacement metal gate stack; performing a first anneal at a first temperature after the replacement metal gate stack has replaced the dummy gate stack. In this method, after performing the first anneal the method further includes: recessing a top portion of the interlayer dielectric; and forming metallic source and drain regions.

In another embodiment, a fin-shaped field effect transistor (finFET) device is disclosed. The device of this embodiment includes a substrate, an insulating layer displaced over the substrate, a fin, and a gate formed over the fin. The gate includes gate includes a gate stack and a high-k dielectric on opposing side of the gate stack. The device also includes metallic source and drain regions formed over the fin and on opposing sides of the gate.

BRIEF DESCRIPTION OF THE SEVERAL VIEWS OF THE DRAWINGS

Referring to the exemplary drawings wherein like elements are numbered alike in the several Figures:

FIGS. 5A-5C shows a fifth stage of forming a finFET device and includes a step related to the formation of a replacement metal gate (RMG) process;

FIGS. 10A-10C shows a third stage of forming metal contacts over the source/drain regions.

DETAILED DESCRIPTION

When the gate length of conventional planar metal oxide semiconductor field effect transistors (MOSFETs) is scaled below 100 nm, problems associated with short channel effects (e.g., excessive leakage between the source and drain regions) become increasingly difficult to overcome. In addition, mobility degradation and a number of process issues also make it difficult to scale conventional MOSFETs to include increasingly smaller device features. New device structures are therefore being explored to improve FET performance and allow further device scaling.

Multi-Gate MOSFETs (MuGFETs) represent one type of structure that has been considered as a candidate for succeeding existing planar MOSFETs. In MuGFETs, two or more gates may be used to control short channel effects. A FinFET is a recent MuGFET structure that exhibits good short channel behavior, and includes a channel formed in a vertical fin. The finFET structure may be fabricated using layout and process techniques similar to those used for conventional planar MOSFETs. The FinFET device often includes active source and drain regions and a channel region that are formed from a silicon fin. The channel region is wrapped with gate materials such as polysilicon, metal materials, or high-k materials.

Figure 1A:
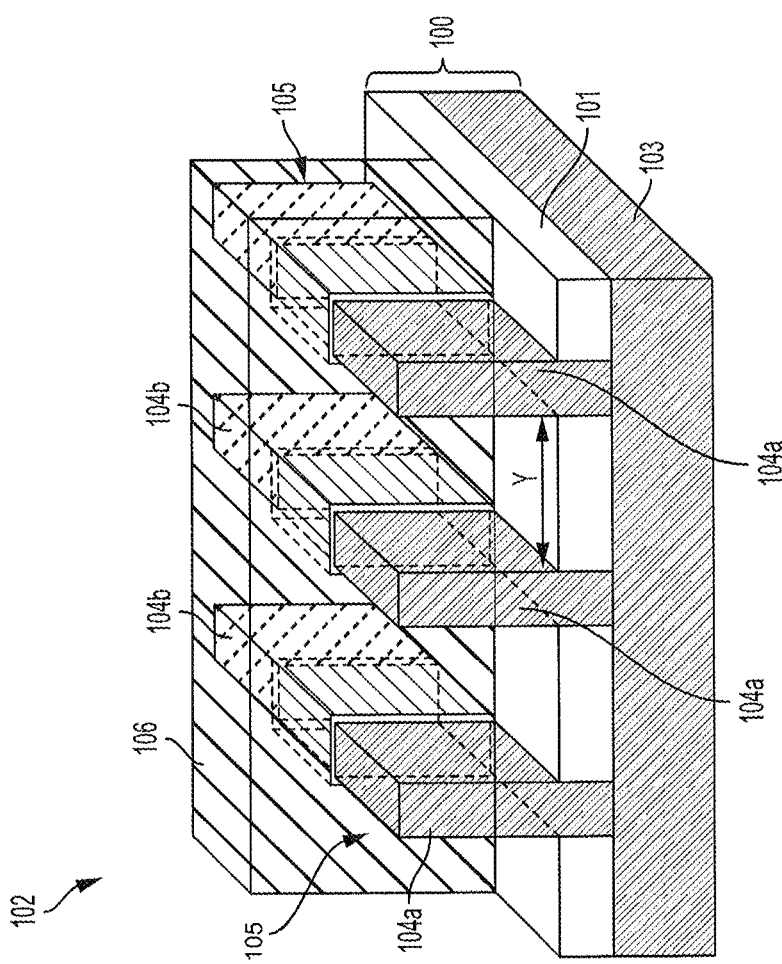
FIG. 1A shows a perspective view of an example of a finFET device.
Figure 1B:
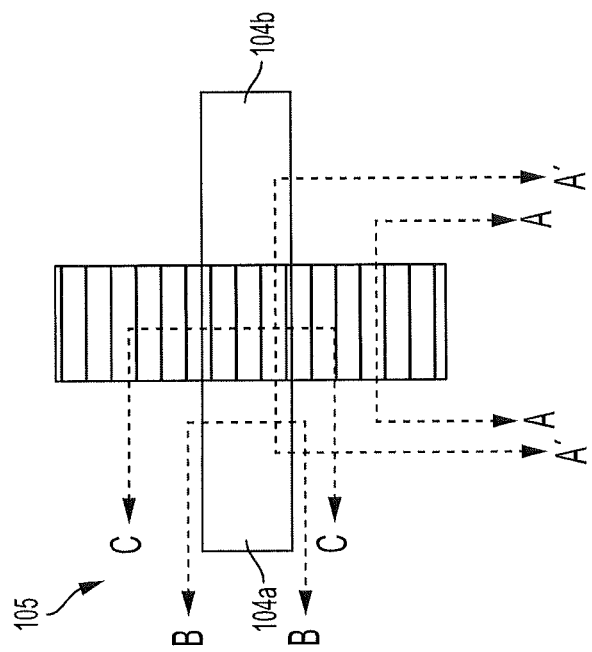
FIG. 1B shows a top view of an example of a finFET device.

FIGS. 1A and 1B illustrate, respectively, perspective and top views of an exemplary arrangement of FinFET devices 102. As shown, a device including three individual fins 105 is illustrated in FIG. 1A, and FIG. 1B shows only a single fin 105. It shall be understood that a FinFET device having any number of individual fins 105 may be formed according to the teachings herein. As illustrated, there are no contacts yet formed on the source and drain.

The FinFET device 102 has individual fins 105 that include fin portions 104 (e.g., a source side 104a and a drain side 104b) that are arranged in parallel and passing through and isolation layer 101 of a substrate 100. The isolation layer 101 may be a shallow trench isolation (STI) layer in one embodiment. In one embodiment, the substrate 101 is a bulk substrate and the fin portions 104 are contiguous with and formed of the same material as the substrate 101.

A gate stack portion 106 is disposed over portions of the fin portions 104. In particular, the fins are shown as having source sides 104a and drain sides 104b. The gate 106 is formed, generally over middle the fins. Application of a voltage to the gate will allow a current to pass from the source side 104*a* to the drain side 104*b* (or vice versa).

In some cases it may be beneficial to form metallic source/drain contacts on the source and drain sides 104*a*, 104*b*. Such processing may be referred to as metallic source drain (MSD) processing herein. Herein, MSD processing is performed after a replacement metal gate (RMG) processing. The inventors hereof have discovered that such ordering may be required because the RMG process requires a thermal anneal step which is beyond the thermal stability of the silicides which would act as the main candidates for MSD (NiSi, ErSi, PtSi, etc.). In one embodiment, the order of processing may also allow for invoking a gate recess in a MSD device. Such a recess may improve bulk FinFET delay and short channel effects.

The following description will define a process flow by which a FinFET may be formed. In FIG. 1B, four different section lines are shown. In the following figures, those labelled with an "A" are a cross-section taken along line A-A or A'-A', those labelled with a "B" are a cross-section taken along B-B and those labelled with a "C" are a cross-section taken along C-C.

Figure 2B:
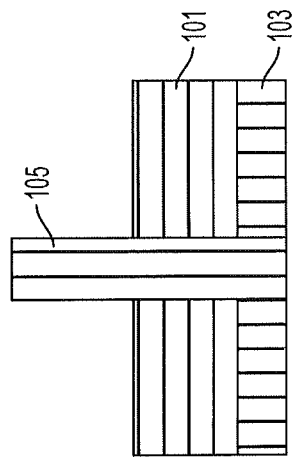
FIGS. 2A-2C shows a second stage of forming a finFET device.
Figure 2C:
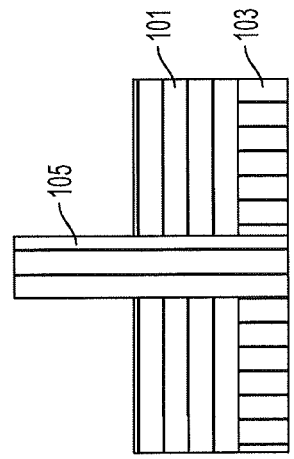
Figure 2A:
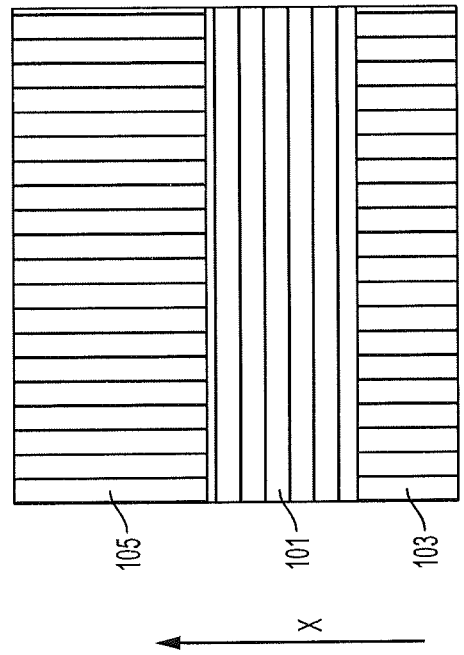

FIGS. 2A-2C shows a first step according to one embodiment and FIG. 2A is taken along line A-A. The device includes a substrate layer 103 with an insulating layer 101 disposed over or directly on it. Herein, the term "over" shall refer to a layer that is disposed further from a substrate layer 103 than another layer (i.e., it if further from the bulk substrate in the "x" direction as labelled in FIG. 2A). The substrate layer 103 includes a fin 105 is formed such that it extends upwardly from the substrate layer 101. The fin 105 and the substrate 103 are formed of the same material in one embodiment. In one embodiment, both the fin 105 and the substrate 103 are formed of a bulk substrate material (e.g., silicon). In practice, the fins may be formed on the substrate layer 103 by etching them out of the substrate layer 103, and then the insulating layer 101 is formed by filling the space between the fins with insulating material, planarizing this material, and then etching this material to reveal a top portion of the fins.

In another embodiment, the substrate layer may be an SOI substrate. In such a case, an insulating layer 101 is formed on top of the SOI substrate (in such a case the insulating layer is called a buried oxide, or BOX, layer) and then another SOI layer is formed over the box layer and the fins are etched out of this "top" SOI layer.

The following description related to FIGS. 3-6 generally describes what is known RMG processing. Certain steps will be generally described but it shall be appreciated that as disclosed herein, performing such RMG processing before forming metallic source/drain contacts may provide certain advantages as described above.

Figure 3B:
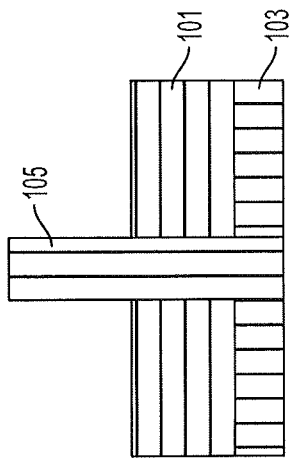
FIGS. 3A-3C shows a third stage of forming a finFET device and includes a step related to the formation of a replacement metal gate (RMG) process.
Figure 3C:
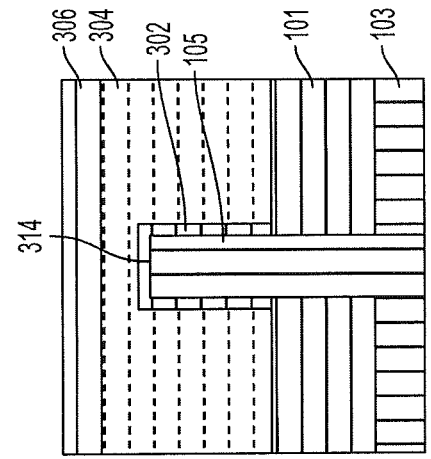
Figure 3A:
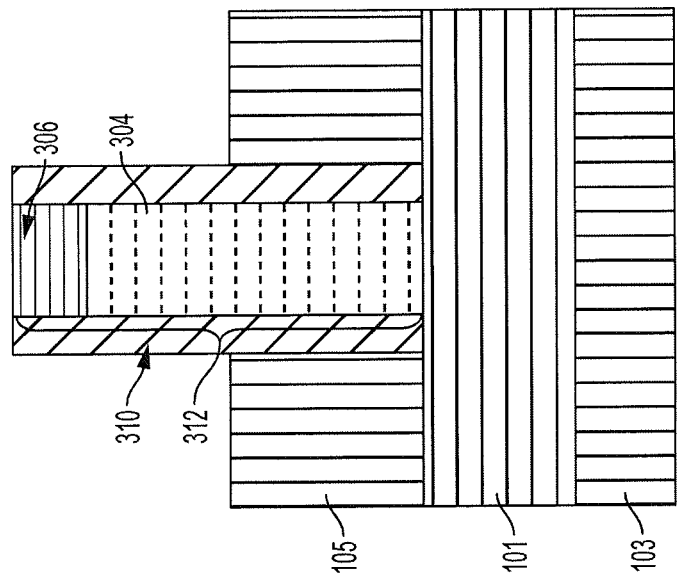

FIGS. 3A-3C shows a next step according to one embodiment and FIG. 3A is taken along line A-A. A dummy gate dielectric 302 may be a deposited or grown oxide layer. The dummy gate dielectric 302 and the insulator 101 are then covered by a dummy gate stack material 304 such as an amorphous silicon. That layer is then covered by a dummy gate cap 306 that may be formed of one or a combination of silicon dioxide, silicon nitride, or amorphous carbon. A pattern may then be etched on the upper surface of the gate cap layer 306 and then a chemical or other process may form a dummy gate stack 312 on to which sidewall spacers 310 may be formed. Formation of the sidewall spacers 310 is within the knowledge of the skilled practitioner. At the end of the processing described in relation to FIGS. 3A-3C a dummy gate stack 312 sandwiched by spacers 310 has been completed. The gate stack 312 is formed as a 3-D element disposed perpendicular to the fin 105 and passes over a top 314 of the fin 105.

Figure 4B:
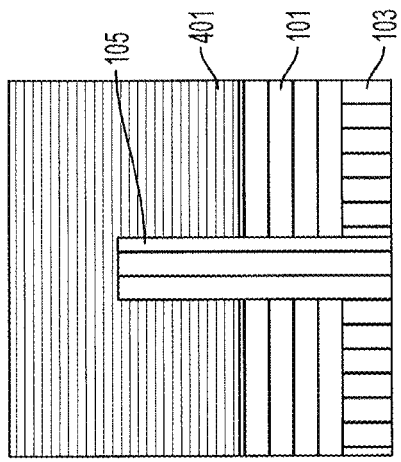
FIGS. 4A-4C shows a fourth stage of forming a finFET device and includes a step related to the formation of a replacement metal gate (RMG) process.
Figure 4C:
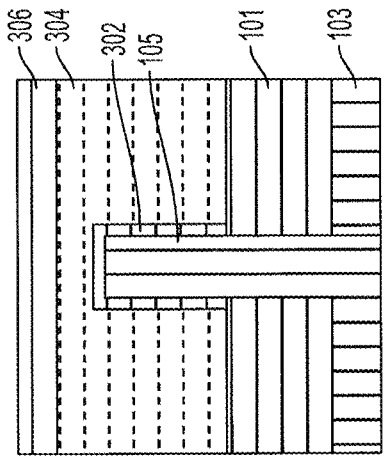
Figure 4A:
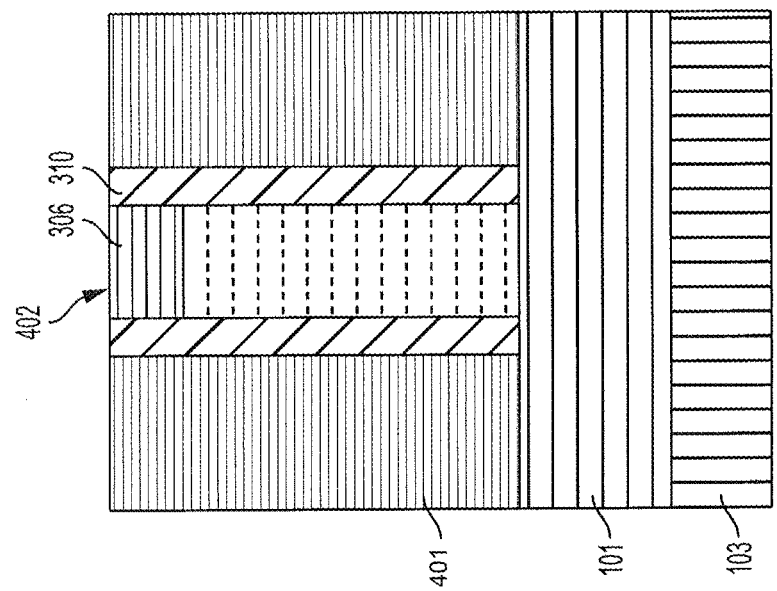

FIGS. 4A-4C shows a next processing step and FIG. 4A is taken along line A-A. In this step, an interlayer dielectric (ILD) 401 is deposited over the entire structure of the FIGS. 3A-3C. Typically, the source and drain regions are doped either before or when the ILD layer 401 is deposited. The ILD layer 401 will serve to cover the source and drain 104 *a*, 104 *b* regions of the fin 105 while the dummy gate 312 is replaced with the actual gate. In FIGS. 4A-4C, the ILD layer 401 is level with a top 402 of the dummy gate cap 306.

FIGS. 5A-5C shows the structure after a portion the dummy gate stack has been removed. FIG. 5A is taken along line A-A.

In particular, the dummy gate stack has been removed such that original fin 105 is shown has been uncovered (e.g, the dummy gate dielectric 302 and the dummy gate stack material have been removed in a region between the spacers 310. This may be accomplished in known manners. In one embodiment, the insulator 101 may optionally be removed in a region between the spacers 310 by a gate recess depth shown at depth D. The recess may reduce delay and short channel effects.

Figure 6A:
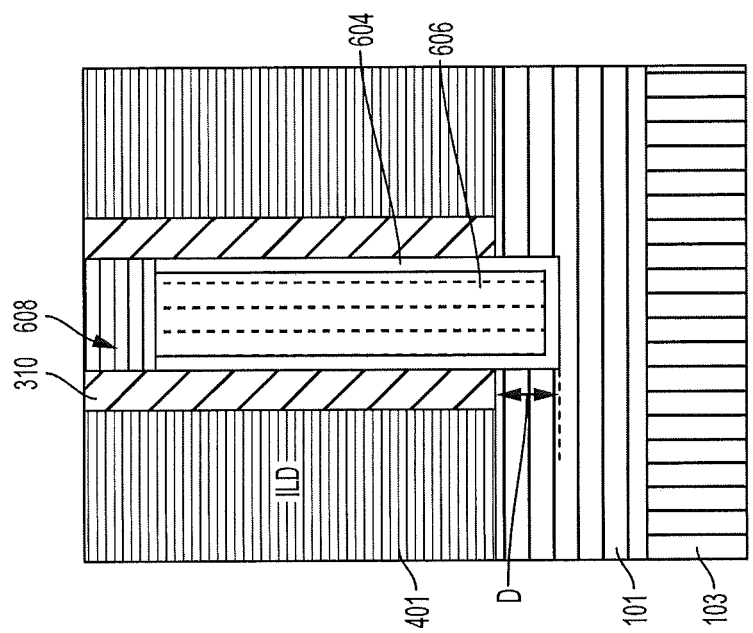
FIGS. 6A-6C shows a sixth stage of forming a finFET device and includes a step related to the formation of a replacement metal gate (RMG) process.
Figure 6B:
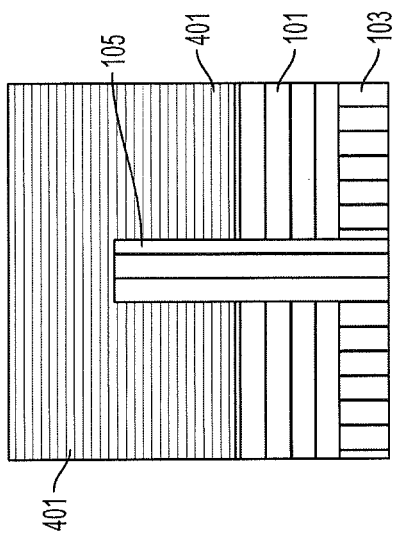
Figure 6C:
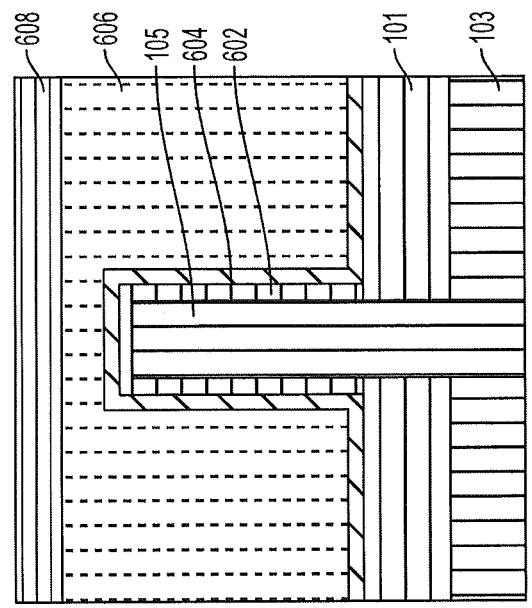

FIGS. 6A-6C shows the finalized gate formed by a RMG processes. In particular, in the region between the spacers 310 has a thin inner layer dielectric layer 602 deposited over the fin 105. Then a high-k dielectric 604 is deposited on or over the thin inner layer dielectric layer 602. This structure is then completed by the addition of gate stack layer 606 and a cap layer 608. The replacement gate stack layer 606 may be formed of one or a combination of workfunction metals (including but not limited to TiN, TiAl, TaN, TiAlC) and a low resistance metal fill (including but not limited to aluminum or tungsten), while the cap layer 608 may comprise one or a combination of silicon dioxide or silicon nitride. Of course, one or more high temperature annealing steps may have also been performed. As discussed above, these anneals may be performed at a temperature that destroys or reduces the effectiveness of metal sources/drains. As such, if the metallic drain/source connections were formed before the RMG processing, the device may not be effective. In FIGS. 6A and 6C it can be seen that the high-k dielectric 604 is formed on opposing sides of the gate stack 606. Such a configuration is typically only found in gates formed by an RMG process.

Figure 7:
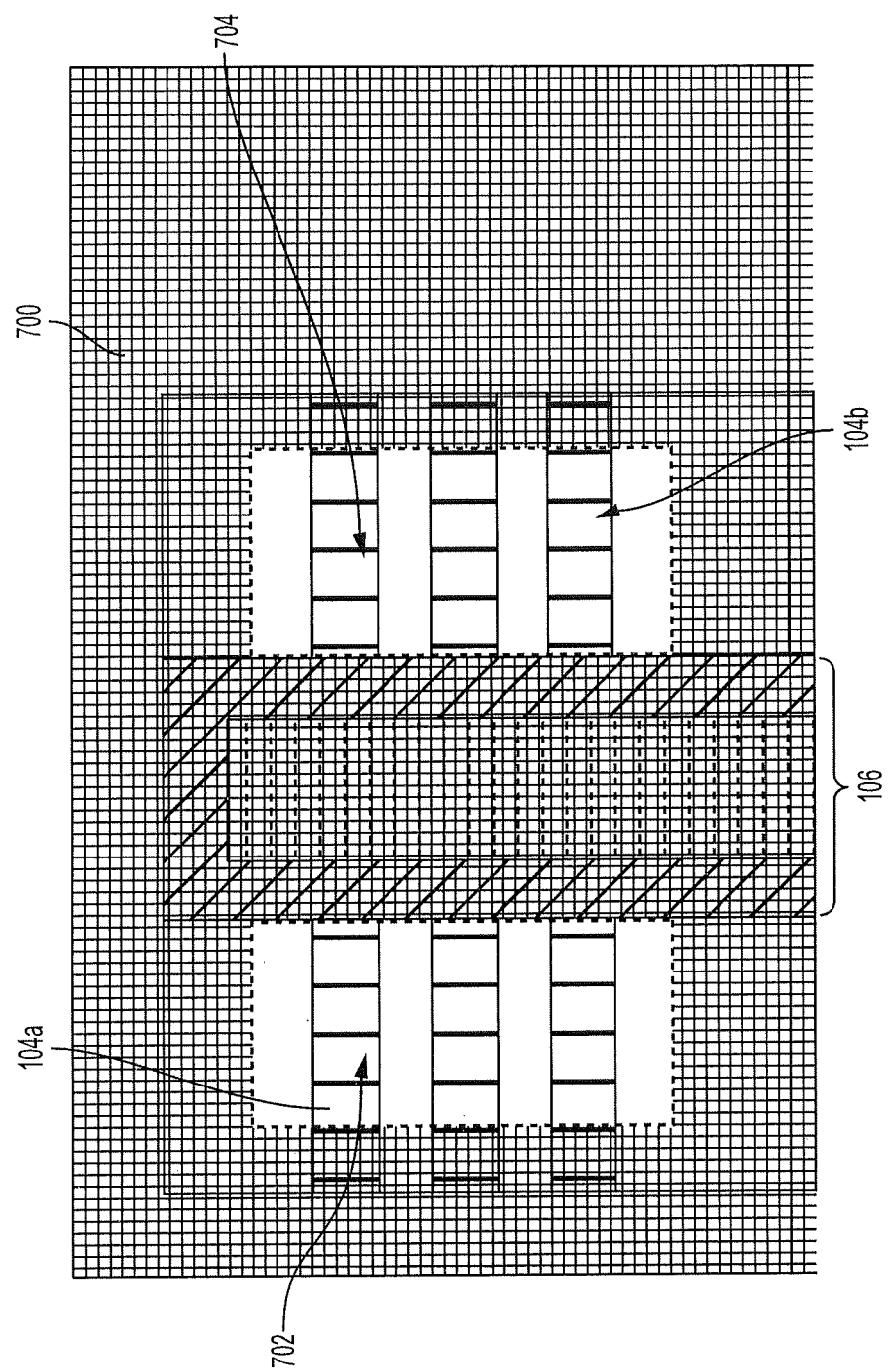
FIG. 7 shows a top view after the stage of FIGS. 6A-6C have been completed and openings have been formed over the source/drain regions of the fins.

FIG. 7 shows a top view of device shown in FIG. 1 after the processing of of FIGS. 6A-6C. In this view, the entire device has been covered by a mask layer 700 with exposed source and drain 702, 704 regions. That is, the source and drain (104*a*, 104*b*) are exposed and the gate stack and other regions are covered.

Figure 8B:
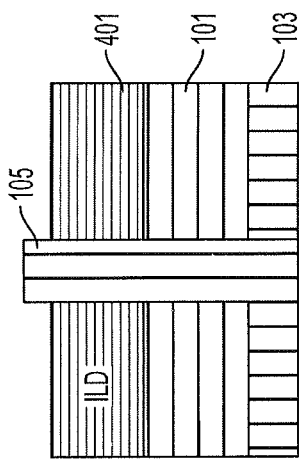
FIGS. 8A-8C shows a first stage of forming metal contacts over the source/drain regions.
Figure 8C:
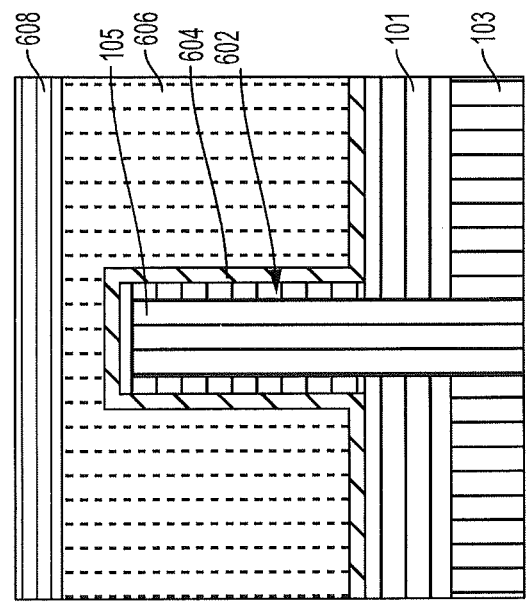
Figure 8A:
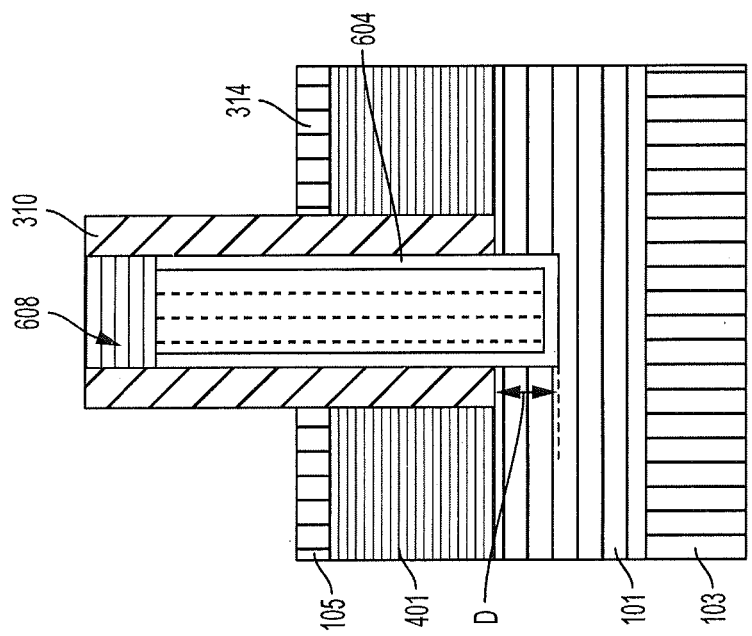

FIGS. 8A-8C shows a next processing step and FIG. 8A is taken along line A-A. In this step, the ILD 401 in a region outside of the spacers 310 is removed to a level slightly below an upper surface (top) 314 of the fin 105.

Figure 9B:
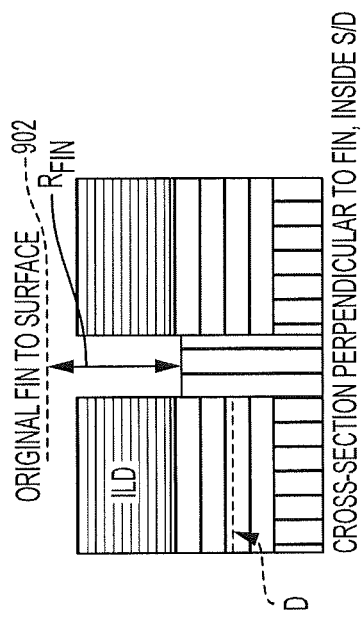
FIGS. 9A-9C shows a second stage of forming metal contacts over the source/drain regions.
Figure 9C:
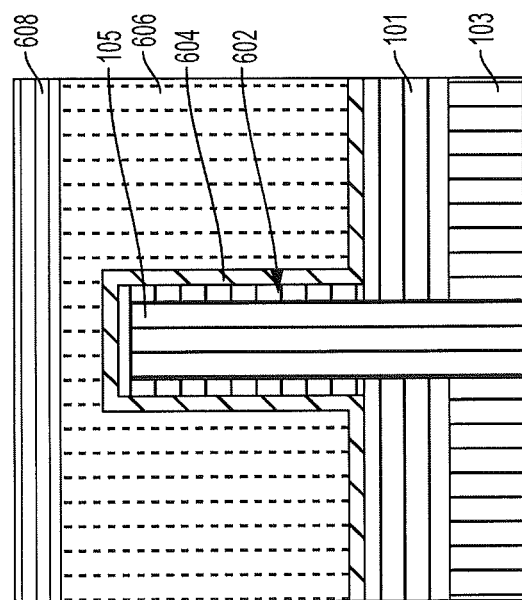
Figure 9A:
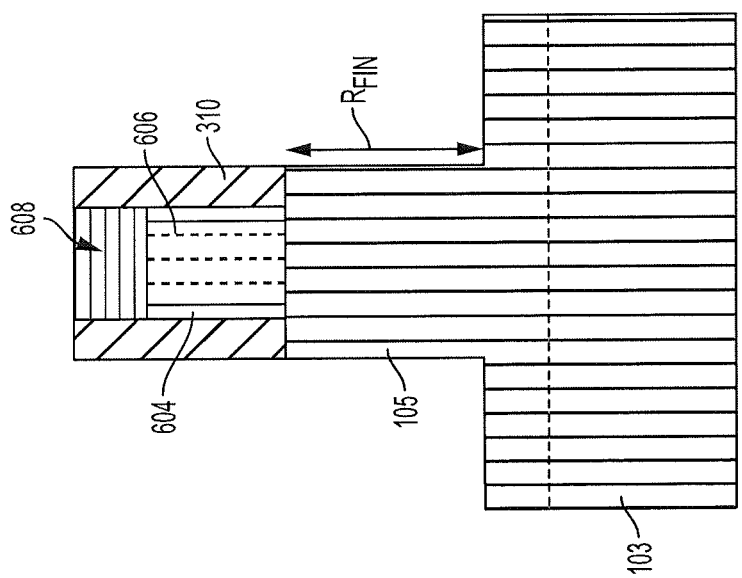

FIGS. 9A-9C shows processing after a fin recess 900 is formed in the fin 105. The depth of the fin recess is shown as $R_{fin}$ with the upper bound being defined as the upper surface 314 (represented by dashed line 902). FIG. 9A and all remaining figures with an A suffix are taken along section lines A'-A' from FIG. 1B.

FIGS. 10A-10C shows the structure after the source/drain have been doped. In one embodiment, a silicide layer 1002 is formed over the fin in the open regions. The layer may be formed with nickel-based material being first deposited over the fin 105 and other exposed regions. Other materials may be used to form the silicide layer, such as platinum, erbium, etc. A dopant (shown as region 1004) may then be introduced into the nickel on the top and sides of the fin 105 and annealed. This anneal causes the metal to become the silicide layer 1002 and the dopant to move into the fin 105. Another option is to first dope the fin and then anneal. Then the nickel or other metal is placed and another anneal occurs that results in the formation of the silicide layer 1002 and the dopant region 1004. It shall be noted that the anneals used to form the silicide layer 1002/dopant regions 1004 are much lower than used in the RMG process and do not harm the gate stack. Yet another option is to utilize a so-called implant into silicide (ITS). In such a process, the implant takes place after the silicide has been formed.

Figure 11B:
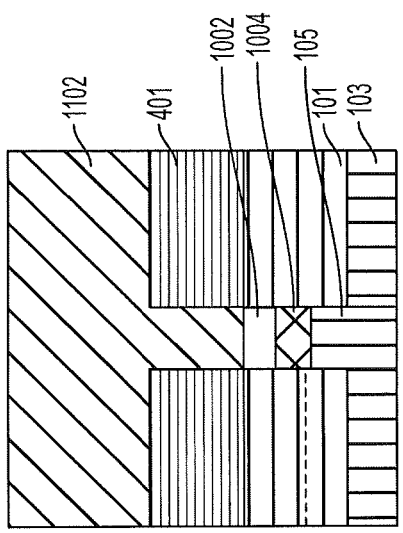
FIGS. 11A-11C shows a fourth stage of forming metal contacts over the source/drain regions.
Figure 11C:
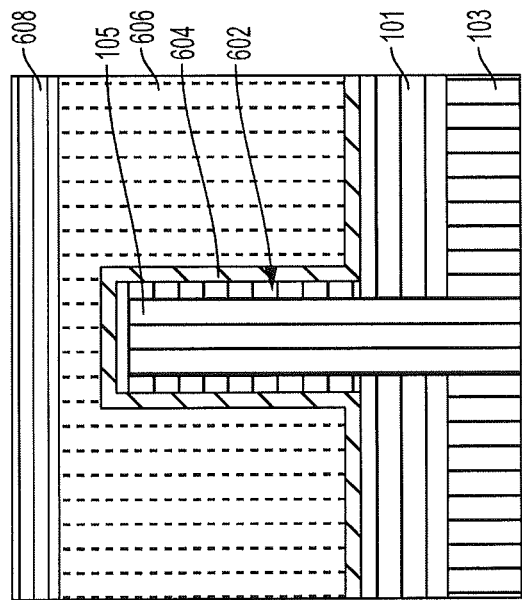
Figure 11A:
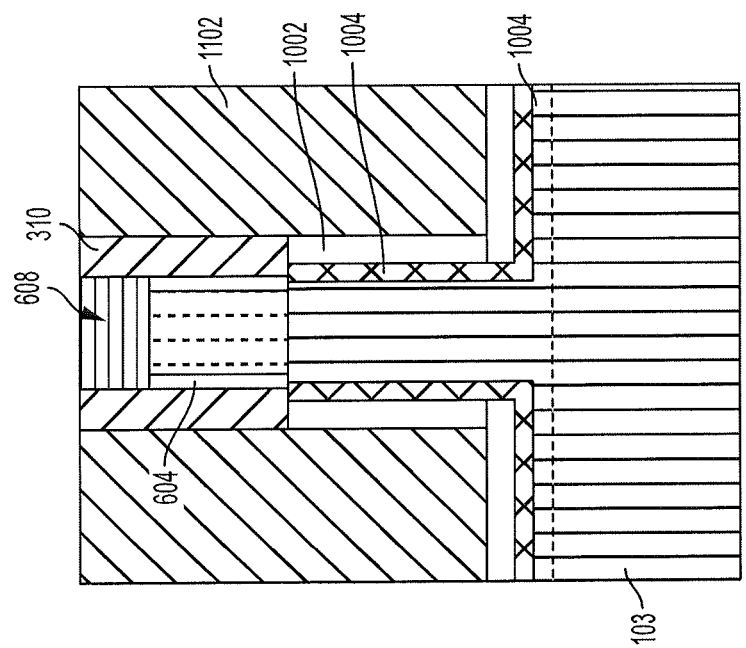

Lastly, the some or all of the open regions 702/704 are filled with a metal source/drain fill material 1102 as shown in FIGS. 11A-11C. The metal source/drain fill material 1102 may be any suitable material such as Al, W, Cu, etc.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A fin-shaped field effect transistor (finFET) device comprising:
    a first fin and an adjacent second fin, both fins extending in a first direction, each fin comprising a channel region, and a source region and a drain region disposed on opposite sides of the channel region, wherein a portion of each of the source and drain regions is recessed relative to the channel region of its respective fin;
    a gate structure extending in a second direction orthogonal to the first direction, disposed over the channel region of both fins; and
    a source metal fill region and a drain metal fill region disposed on opposite sides of the gate structure, each of the source and drain metal fill regions comprising an upper portion, and first and second lower portions corresponding to the first fin and the second fin respectively, wherein:
        the upper portion and the lower portions of the source metal fill region comprise a continuous metal fill material;
        the upper portion and the lower portions of the drain metal fill region comprise the continuous metal fill material;
        the upper portion of each of the source and drain metal fill regions extends in the second direction past the first fin and past the second fin;
        sidewall spacers are disposed between the upper portion of each of the source and drain metal fill regions and conductive portions of the gate structure;
        the first lower portions of the source and drain metal fill regions are in-line with the channel region of the first fin and are disposed in the recessed portions of the source and drain regions of the first fin;
        the second lower portions of the source and drain metal fill regions are in-line with the channel region of the second fin and are disposed in the recessed portions of the source and drain regions of the second fin;
        the first and second lower portions of the source metal fill region are separated in the second direction by interlayer dielectric material; and
        the first and second lower portions of the drain metal fill region are separated in the second direction by interlayer dielectric material.

2. The finFET device of claim 1, further comprising: a source silicide layer and a drain silicide layer disposed on the opposite sides of each channel region, wherein each source and drain silicide layer comprises a first portion disposed between a corresponding channel region and a corresponding lower portion of a source or drain metal fill region.

3. The finFET device of claim 2, wherein the source and drain silicide layers each comprise a second portion disposed between a top surface of a recessed portion of a source or drain region of a corresponding fin and a corresponding lower portion of a source or drain metal fill region.

4. The finFET device of claim 3, wherein the first and second portions of the source and drain silicide layers are contiguous.

5. The finFET device of claim 2, wherein the source and drain silicide layers at least partially underlies an outer edge of a corresponding sidewall spacer.

6. The finFET device of claim 1, wherein each upper portion of the source and drain metal fill regions is disposed within interlayer dielectric material adjacent to the gate structure.

7. The finFET device of claim 2, wherein the source and drain silicide layers comprise nickel, platinum, or erbium.

8. The finFET device of claim 1, wherein the source and drain metal fill regions comprise tungsten, aluminum, or copper.

9. A field effect transistor device comprising:
    a first fin and an adjacent second fin, both fins extending in a first direction, each fin comprising a channel region, and a source region and a drain region disposed on opposite sides of the channel region, wherein a portion of the source and drain regions is recessed relative to the channel region of its respective fin;
    a gate structure extending in a second direction orthogonal to the first direction, disposed over the channel region of both fins; and
    a source metal fill region and a drain metal fill region disposed on opposite sides of the gate structure, the source and drain metal fill regions comprising an upper portion, and first and second lower portions corresponding to the first fin and the second fin respectively, wherein:
        the upper portion and the lower portions of the source metal fill region comprise a continuous metal fill material;
        the upper portion and the lower portions of the drain metal fill region comprise the continuous metal fill material;
        the upper portion of the source and drain metal fill regions extends in the second direction past the first fin and past the second fin;
        sidewall spacers are disposed between the upper portion of the source and drain metal fill regions and conductive portions of the gate structure;

the first lower portions of the source and drain metal fill regions are self-aligned with the channel region of the first fin;

the second lower portions of the source and drain metal fill regions are self-aligned with the channel region of the second fin;

the first and second lower portions of the source metal fill region are separated in the second direction by interlayer dielectric material; and the first and second lower portions of the drain metal fill region are separated in the second direction by interlayer dielectric material.

10. The field effect transistor device of claim 9, wherein the self-aligned first and second lower portions each have a cross-sectional shape that is substantially the same as a cross-sectional shape of the corresponding channel region.

11. The field effect transistor device of claim 9, further comprising:

a source silicide layer and a drain silicide layer disposed on the opposite sides of each channel region, wherein the source and drain silicide layers comprises:

a first portion disposed between a corresponding channel region and a corresponding lower portion of a source or drain metal fill region; and a second portion disposed between a top surface of a recessed portion of a source or drain region of a corresponding fin and a corresponding lower portion of a source or drain metal fill region.

12. The field effect transistor device of claim 9, wherein each upper portion of the source and drain metal fill regions is disposed within interlayer dielectric material adjacent to the gate structure.

13. The field effect transistor device of claim 11, wherein the source and drain silicide layers comprise nickel, platinum, or erbium.

14. The field effect transistor device of claim 9, wherein the source and drain metal fill regions comprise tungsten, aluminum, or copper.

15. A field effect transistor device, comprising:

a first fin and an adjacent second fin, both fins extending in a first direction, each fin comprising a channel region, and a source region and a drain region disposed on opposite sides of the channel region, wherein a portion of the source and drain regions is recessed relative to the channel region of its respective fin;

a gate structure extending in a second direction orthogonal to the first direction, disposed over the channel region of both fins;

a source metal fill region and a drain metal fill region disposed on opposite sides of the gate structure, the source and drain metal fill regions comprising an upper portion, and first and second lower portions corresponding to the first fin and the second fin respectively; and a source silicide layer and a drain silicide layer disposed on the opposite sides of each channel region, wherein:

the upper portion and the lower portions of the source metal fill region comprise a continuous metal fill material;

the upper portion and the lower portions of the drain metal fill region comprise the continuous metal fill material;

the upper portion of the source and drain metal fill regions extends in the second direction past the first fin and past the second fin;

sidewall spacers are disposed between the upper portion of the source and drain metal fill regions and conductive portions of the gate structure;

the first lower portions of the source and drain metal fill regions are in-line with the channel region of the first fin;

the second lower portions of the source and drain metal fill regions are in-line with the channel region of the second fin;

the first and second lower portions of the source metal fill region are separated in the second direction by interlayer dielectric material;

the first and second lower portions of the drain metal fill region are separated in the second direction by interlayer dielectric material; and the source and drain silicide layers comprise:

a first portion disposed between a corresponding channel region and a corresponding lower portion of a source or drain metal region; and a second portion disposed between a top surface of a recessed portion of a source or drain region of a corresponding fin and a corresponding lower portion of a source or drain metal region.

16. The field effect transistor device of claim 15, wherein the first and second lower portions of the source and drain metal fill regions are self-aligned to the corresponding channel region in the first direction.

17. The field effect transistor device of claim 16, wherein the self-aligned first and second lower portions have a cross-sectional shape that is substantially the same as a cross-sectional shape of the corresponding channel region.

18. The field effect transistor device of claim 15, wherein each upper portion of the source and drain metal fill regions is disposed within interlayer dielectric material adjacent to the gate structure.

19. The field effect transistor device of claim 15, wherein the source and drain silicide layers comprise nickel, platinum, or erbium.

20. The field effect transistor device of claim 15, wherein the source and drain metal fill regions comprise tungsten, aluminum, or copper.

* * * * *